US009179585B2

(12) United States Patent
Guo et al.

(10) Patent No.: US 9,179,585 B2
(45) Date of Patent: Nov. 3, 2015

(54) POSITIONING DEVICE FOR INSERTING PIN INTO PRINTED CIRCUIT BROAD

(75) Inventors: Youru Guo, Shanghai (CN); Hao Zhang, Shanghai (CN)

(73) Assignee: Tyco Electronics (Shanghai) Co. Ltd., Shanghai (CN)

( * ) Notice: Subject to any disclaimer, the term of this patent is extended or adjusted under 35 U.S.C. 154(b) by 1041 days.

(21) Appl. No.: 13/283,960

(22) Filed: Oct. 28, 2011

(65) Prior Publication Data

US 2012/0102731 A1    May 3, 2012

(30) Foreign Application Priority Data

Oct. 28, 2010 (CN) .......................... 2010 1 0527418

(51) Int. Cl.
*B23P 19/00* (2006.01)
*H05K 13/00* (2006.01)

(52) U.S. Cl.
CPC ........ *H05K 13/0015* (2013.01); *H05K 13/0069* (2013.01); *Y10T 29/4913* (2015.01)

(58) Field of Classification Search
CPC ............ H05K 13/006; H05K 13/0015; H05K 13/023; H05K 13/0053; H05K 13/0417; H05K 13/0069; Y10T 29/4913; Y10T 29/46139; Y10T 29/53174
USPC .................................. 29/721, 739, 832, 837
See application file for complete search history.

(56) References Cited

U.S. PATENT DOCUMENTS

| 4,127,936 | A | * | 12/1978 | Schlup et al. | ................... | 29/721 |
| 4,265,013 | A | * | 5/1981 | Brown et al. | ................... | 29/739 |
| 4,610,084 | A | * | 9/1986 | Anderson et al. | ............... | 29/834 |

* cited by examiner

*Primary Examiner* — Donghai D Nguyen
(74) *Attorney, Agent, or Firm* — Barley Snyder

(57) ABSTRACT

A positioning device is provided for inserting a pin into a PCB. The positioning device includes an X-Y platform and a reference platform. The X-Y platform includes a positioning point and supports a PCB having a first receiving passageway for receiving a pin. The reference platform supports a reference template having a reference point that corresponds with the first receiving passageway. An x-axis guide rail and a y-axis guide rail is disposed on the X-Y platform, such that the positioning point on the X-Y platform is moveable relative to the reference template in an x-axis direction and/or a y-axis direction to align the first receiving passageway on the PCB with a fixed insertion point of a pin insertion machine.

9 Claims, 3 Drawing Sheets

POSITIONING DEVICE FOR INSERTING PIN INTO PRINTED CIRCUIT BROAD

CROSS-REFERENCE TO RELATED APPLICATION

This application claims priority under 35 U.S.C. §119 to Chinese Patent Application No. 201010527418.X filed on Oct. 28, 2010 in China.

FIELD OF INVENTION

The invention relates to a positioning device, and in particular to a positioning device for inserting a pin into a printed circuit board (PCB) at a fixed insertion point by using a pin insertion machine.

BACKGROUND

In the prior art, a servo motor or a stepping motor is typically used to drive an X-Y platform on which a printed circuit board (PCB) is arranged when a pin is inserted into the PCB by using a pin insertion machine, so as to position the PCB in a proper location. Pins are then inserted into holes formed in the PCB by the pin insertion machine.

In order to position the PCB, a complicated control system is employed to control the servo motor or the stepping motor, which in turn moves the X-Y platform with the PCB mounted thereon to position the PCB. Such a system for of positioning the PCB is complicated and causes high cost.

SUMMARY OF INVENTION

The present invention is provided, inter alia, to overcome or alleviate at least one aspect of the above mentioned disadvantages.

A positioning device is provided for inserting a pin into a PCB. The positioning device includes an X-Y platform and a reference platform. The X-Y platform includes a positioning point and supports a PCB having a first receiving passageway and to be inserted with a pin. The reference platform supports a reference template having a reference point that correspond with the first receiving passageway. An x-axis guide rail and a y-axis guide rail is disposed on the X-Y platform, such that the positioning point on the X-Y platform is moveable relative to the reference template in an x-axis direction and/or a y-axis direction to align the first receiving passageway on the PCB with a fixed insertion point of a pin insertion machine.

BRIEF DESCRIPTION OF THE DRAWINGS

These and/or other aspects and advantages of the present invention will become apparent and more readily appreciated from the following description of the embodiments, taken in conjunction with the accompanying drawings of which.

DETAILED DESCRIPTION OF EMBODIMENTS

Figure 1:
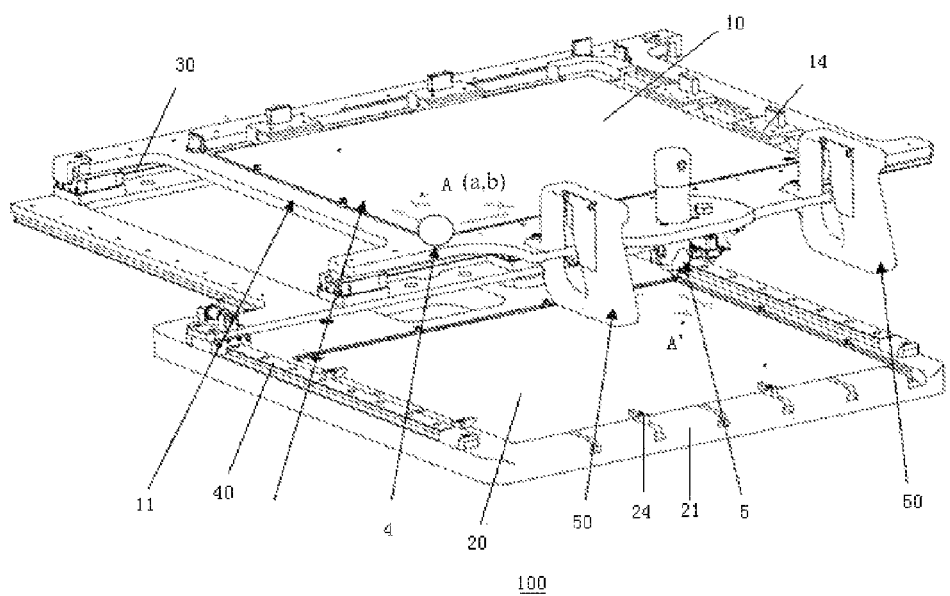
FIG. 1 is a perspective view of a positioning device according to the invention for inserting a pin into a PCB.

Embodiments of the present invention will be described hereinafter in detail with reference to the attached drawings, wherein the like reference numerals refer to the like elements throughout the specification. These embodiments should not be construed as limiting the invention to the embodiments set forth herein, but rather are for illustrative purpose.

Figure 2:
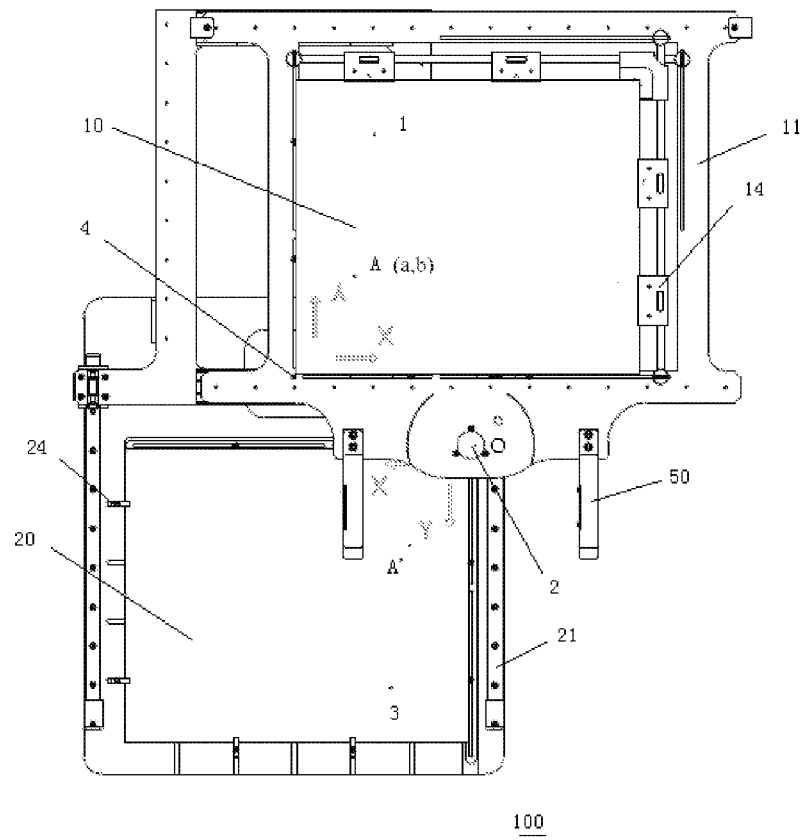
FIG. 2 is a plan view of the positioning device shown in FIG. 1.
Figure 3:
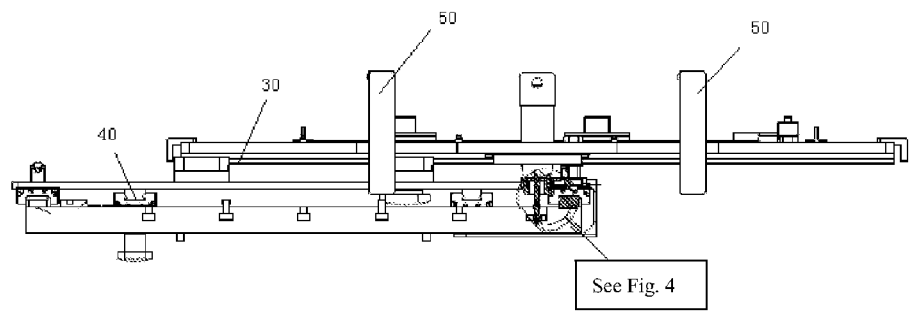
FIG. 3 is front view of the positioning device shown in FIG. 1.

Referring to FIGS. 1-3, a positioning device 100 for inserting a pin into a PCB according to an embodiment of the invention will be described. The positioning device 100 includes an X-Y platform 11 that serves to support a PCB 10, a reference platform 21, and a reference template 20 The PCB 10 is provided with a first receiving passageway 1, and the X-Y platform 11 is provided with a positioning point 2. The reference template 20 is supported on the reference platform 21 and provided with at least one reference point 3 corresponding to the first receiving passageway 1. The X-Y platform 11 includes an x-axis guide rail 30 and a y-axis guide rail 40 so that the positioning point 2 on the X-Y platform 11 is adapted to be moved with respect to the reference template 20 in an x-axis direction and/or a y-axis direction to be aligned with (e.g., right above) each of the at least one reference point 3 on the reference template 20. The positioning point 2 is moved to a position aligned with (e.g., right above) the at least one reference point 3, where the first receiving passageway 1 on the PCB 10 is aligned with (e.g., right above) a fixed insertion point 4 for a pin insertion machine (not shown). The fixed insertion point 4 herein is right below an insertion head of the pin insertion machine.

It should be noted that the relative position of the X-Y platform 11 and the reference platform 21 shown in FIGS. 1-3 is for illustration rather than for limitation. For example, in FIG. 2, the reference platform 21 can be provided at a left side, a right side or an upper side of the X-Y platform 11, and accordingly, the position of the positioning point 2 is changed correspondingly. For example, in FIG. 2, the fixed insertion point 4 is at a bottom left corner of the PCB 10 to be inserted, and the positioning point 2 is at a top right corner of the reference template 20. In another example where the reference platform 21 is positioned at the right side of the X-Y platform 11, the positioning point 2 can be at a bottom left corner of the reference template 20. Further, the X-Y platform 11 and the reference platform 21 can be spaced from each other with a greater distance instead of being adjacent to each other as shown in FIGS. 1-3. The above is only for illustration, and the X-Y platform 11 and the reference platform 21 can be arranged in other different manners based on the inventive concept of the present invention.

In addition, one skilled in the art will appreciate that the positioning point 2 can be formed integrally with the X-Y platform 11, or be directly or indirectly connected to the X-Y platform 11.

The reference template 20 herein can be formed as a plate arranged on the reference platform 21. In one example, the reference template 20 can form the surface of the reference platform 21. The reference point 3 can be provided on the reference template 20, and the reference point 3 can be formed as a mark, for instance, a circular point, a recess, or a hole. For different PCBs 10 to be inserted, a different reference template 20 can be used and/or different reference points on the reference template 20 are used. Preferably, the reference point 3 has the same structure corresponding to the first receiving passageway 1. For example, the reference point 3 can be formed as a spherical recess, a conical hole, a cylindrical hole or the like.

In the shown embodiment, the reference template 20 can be a reference PCB having the same structure as that of the PCB 10 to be inserted and including at least one second receiving passageway. Such second receiving passageway can be used as a reference point 3. One of the PCB 10 to be inserted and reference template 20 (e.g., the reference template 20 can be another PCB that is the same as the PCB 10). Depending on the relative position between the X-Y platform 11 and the reference platform 21, the PCB used as the reference template can have different orientation on the reference platform 21. The reference template 20 can be a customized template made of a metal material or other materials.

As shown in FIGS. 1-4, the X-Y platform 11 is provided with a positioning member 5 having an elongated member 6. The elongated member 6 has a tip end 8 adapted to be extended into the second receiving passageway (or the reference point 3) on the reference template 20. The tip end 8 of the elongated member 6 can be formed as the positioning point 2.

Figure 4:
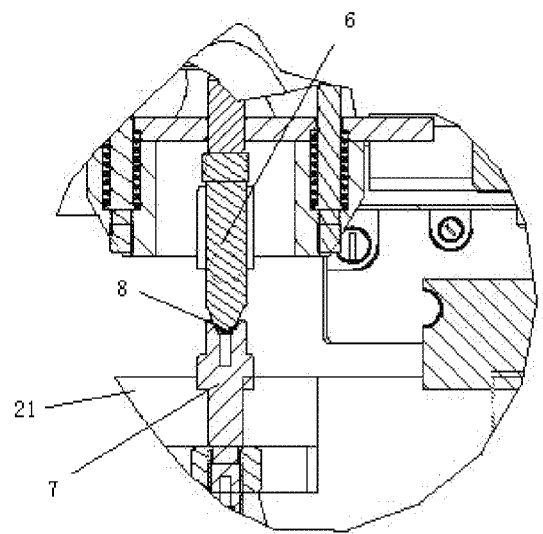
FIG. 4 is a partially enlarged sectional view of a positioning member according to the invention.

As shown in FIG. 4, the positioning device 100 further includes a positioning reference point 7, which can be provided on the reference platform 21 or other position fixed with respect to the reference platform 21. As is shown in FIG. 2, the PCB 10 is positioned in a plane defined by a first plane of right-angle coordinate (a first XY plane) having its coordinate origin at the fixed insertion point 4. The reference template 20 is positioned in a plane defined by a second plane of right-angle coordinate (a second XY plane) having its coordinate origin at the positioning reference point 7. The x-axis of the second plane of right-angle coordinate is parallel with or coincides with the x-axis of the first plane of right-angle coordinate.

The initial position of the positioning point 2 is aligned with the positioning reference point 7. For example, the initial position of the positioning point 2 is right above the positioning reference point 7. The positioning reference point 7 is positioned dependent on the relative position between the X-Y platform 11 and the reference platform 21, the position of the reference template 20 on the reference platform 21, and the position of the PCB 10 to be inserted on the X-Y platform 11, so that the position of any point on the PCB 10 with respect to the insertion point 4 (x-axis distance and y-axis distance) corresponds to the position of a corresponding point on the reference template 20 with respect to the position of the positioning point 2 (x-axis distance and the y-axis distance).

For instance, in FIG. 2, the coordinates of point A on the PCB 10 are (a, b) relative to the insertion point 4 as the coordinate origin. In such as case, the coordinates of the corresponding point A' on the reference template 20 are also (a, b) with respect to the positioning point 2 as the coordinate origin. Thus, in FIG. 2, when the positioning point 2 on the PCB 10 is moved left by a distance "a" and moved downwards by a distance "b" to arrive at point A', point A on the PCB 10 is also moved left by a distance "a" and moved downwards by a distance "b" to arrive at the insertion point 4.

Figure 5:
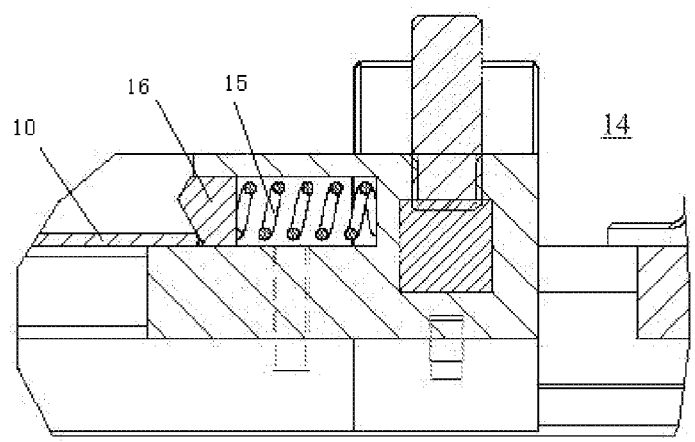
FIG. 5 is a partially enlarged sectional view of a first fixing member according to the invention.

Referring to FIGS. 1-2, the X-Y platform 11 is provided with a first fixing member 14 for removably securing the PCB 10 to the X-Y platform 11. Further, the reference platform 21 is provided with a second fixing member 24 for removably securing or retaining the reference template 20 on the reference platform 21. As is shown in FIG. 5, the first fixing member 14 includes a spring 15 and a locking tongue 16 biased by the spring 15. The locking tongue 16 is capable of elastically biasing the PCB 10 to fix the PCB 10 at its position. The structure of the second fixing member 24 can be different from that of the first fixing member 14.

As is shown in FIG. 1, the X-Y platform 11 is provided with a handle 50, for use by an operator to move the X-Y platform 11 relative to the reference platform 21. The handle 50 in FIGS. 1-3 is only for illustration and can have other different structures. Additionally, the handle 50 and the positioning point or the positioning member 5 can have different position relations. For example, the positioning point 2 can be provided directly to the handle 50.

A light emitting device can be provided on the insertion head of the pin insertion machine to emit a light beam towards the fixed insertion point 4. The light beam emitted is preferably a colored light beam. Thus, when the positioning point 2 is located right above the corresponding reference point 3, the light beam irradiates a first receiving passageway 1 where an inserting operation is desired. The light beam helps the operator to judge whether the positioning point 2 is moved to a position right above the correct reference point.

According to another aspect of the invention, a method is provided for inserting a pin into a PCB at a fixed insertion point 4 by using a pin insertion machine. The method, according the invention, may include the following steps:

(1) positioning a PCB 10 to be inserted on an X-Y platform 11, wherein the PCB 10 to be inserted is formed with a first receiving passageway 1, and the X-Y platform 11 is formed with a positioning point 2;

(2) positioning a reference template 20 to a reference platform 21, wherein the reference template 20 is formed with at least one reference point 3 corresponding to the first receiving passageway 1 respectively;

(3) moving the X-Y platform 11 relative to the reference platform 21 so that the positioning point 2 is moved to a position right above the reference point 3 on the reference template 20, and that one corresponding first receiving passageway 1 on the PCB 10 is moved right above the fixed insertion point 4;

(4) inserting a pin into the first receiving passageway 1 formed in the PCB 10 right above the fixed insertion point 4 by means of the pin insertion machine.

As mentioned above, the reference template 20 can be a reference PCB having the same structure as that of the PCB 10 and including at least one second receiving passageway. Such second receiving passageway can form one reference point 3.

The X-Y platform 11 can be provided with a positioning member 5 having an elongated member 6. The elongated member 6 may include a tip end 8 adapted to be extended into the second receiving passageway (or the reference point 3) and be formed as the positioning point 2. The above step (3) can further include extending the tip end 8 of the elongated member 6 into the second receiving passageway, when the X-Y platform 11 is moved relative to the reference platform 21 so that the positioning point 2 is moved to the position right above the reference point 3. This helps to fix the position of the x-y platform 11 or the position of the PCB 10 on the x-y platform 11 during the inserting operation of the pin insertion machine.

The method further includes step (5) of retracting the tip end 8 of the elongated member 6 from the second receiving passageway, after the one pin is inserted into the first receiving passageway 1 on the PCB 10 right above the fixed insertion point 4 by means of the pin insertion machine. The above steps (3)-(5) can be repeated to insert one or more pin into other corresponding first receiving passageway(s) on the PCB 10 to be inserted.

According to still another aspect of the invention, an apparatus is provided for inserting a pin into a PCB. The apparatus can include the above described positioning device 100 and the pin insertion machine for inserting the pin into the PCB 10 fixed to the X-Y platform 11.

Although several exemplary embodiments have been shown and described, it would be appreciated by those skilled in the art that various changes or modifications can be made in these embodiments without departing from the principles and spirit of the disclosure, the scope of which is defined in the appended claims and their equivalents.

What is claimed is:

1. A positioning device, comprising:
    an X-Y platform having a positioning point and supporting a printed circuit board having a first receiving passageway for receiving a pin;
    a reference platform supporting a reference template having a reference point corresponding to the first receiving passageway; and
    an x-axis guide rail and a y-axis guide rail disposed on the X-Y platform;
    wherein the positioning point on the X-Y platform is moveable relative to the reference template in at least one of an x-axis direction and a y-axis direction to align the first receiving passageway with a fixed insertion point where the pin is inserted into the first receiving passageway.

2. The positioning device according to claim 1, wherein the positioning point is alignable with the reference point on the reference template when the positioning point on the X-Y platform moves relative to the reference platform in the at least one of the x-axis direction and the y-axis direction and the first receiving passageway is aligned with the fixed insertion point.

3. The positioning device according to claim 2, wherein the reference template includes a reference printed circuit board having (a) a same structure as that of the printed circuit board into which the pin is inserted and (b) a second receiving passageway.

4. The positioning device according to claim 3, wherein the second receiving passageway is the reference point.

5. The positioning device according to claim 3, wherein the X-Y platform includes a positioning member having an elongated member with a tip end that extends extended into the second receiving passageway in the reference printed circuit board.

6. The positioning device according to claim 5, wherein the tip end is formed as the positioning point.

7. The positioning device according to claim 2, wherein the reference platform includes a fixing member for removably securing the reference template to the reference platform.

8. The positioning device according to claim 1, wherein the X-Y platform includes platform handle for use by an operator to move the X-Y platform to correspond with the reference platform.

9. The positioning device according to claim 1, wherein the reference platform is immovably mounted with respect to the fixed insertion point.

* * * * *